(12) United States Patent
Yang et al.

(10) Patent No.: US 10,381,202 B2
(45) Date of Patent: Aug. 13, 2019

(54) MAGNETRON AND MAGNETRON SPUTTERING DEVICE

(71) Applicant: BEIJING NAURA MICROELECTRONICS EQUIPMENT CO., LTD., Beijing (CN)

(72) Inventors: Yujie Yang, Beijing (CN); Qiang Li, Beijing (CN); Guoqing Qiu, Beijing (CN); Zhimin Bai, Beijing (CN); Hougong Wang, Beijing (CN); Peijun Ding, Beijing (CN); Feng Lv, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 0 days.

(21) Appl. No.: 15/113,760

(22) PCT Filed: Dec. 31, 2014

(86) PCT No.: PCT/CN2014/095758
§ 371 (c)(1),
(2) Date: Jul. 22, 2016

(87) PCT Pub. No.: WO2015/109927
PCT Pub. Date: Jul. 30, 2015

(65) Prior Publication Data
US 2017/0011894 A1    Jan. 12, 2017

(30) Foreign Application Priority Data
Jan. 23, 2014    (CN) .......................... 2014 1 0032274

(51) Int. Cl.
*C23C 14/34* (2006.01)
*C23C 14/35* (2006.01)
(Continued)

(52) U.S. Cl.
CPC ...... *H01J 37/3405* (2013.01); *C23C 14/0641* (2013.01); *C23C 14/14* (2013.01);
(Continued)

(58) Field of Classification Search
CPC ............... H01J 37/3405; H01J 37/3408; H01J 37/3452; C23C 14/0641; C23C 14/14; C23C 14/3414; C23C 14/35
See application file for complete search history.

(56) References Cited

U.S. PATENT DOCUMENTS

| 4,892,633 A | * | 1/1990 | Welty | .................. | C23C 14/3407 204/192.12 |
| 5,705,429 A | * | 1/1998 | Yamaha | .............. | H01L 21/2855 204/192.17 |

(Continued)

FOREIGN PATENT DOCUMENTS

CN    102789938 A    11/2012

OTHER PUBLICATIONS

PCT/CN2014/095758 International Search Report dated Mar. 25, 2015; 2 pgs.

*Primary Examiner* — John J Brayton
(74) *Attorney, Agent, or Firm* — Anova Law Group, PLLC

(57) ABSTRACT

Embodiments of the invention provide a magnetron and a magnetron sputtering device, including an inner magnetic pole and an outer magnetic pole with opposite polarities. Both the inner magnetic pole and the outer magnetic pole comprise multiple spirals. The spirals of the outer magnetic pole surround the spirals of the inner magnetic pole, and a (Continued)

gap exists therebetween. In addition, the gap has different widths in different locations from a spiral center to an edge. Moreover, both the spirals of the outer magnetic pole and the spirals of the inner magnetic pole follow a polar equation: $r=a\theta n+b(\cos \theta)m+c(\tan \theta)k+d$, $0<=n<=2$, $0<=m<=2$, $c=0$ or $k=0$. Because the gap between the inner magnetic pole and the outer magnetic pole has the different widths in a spiral discrete direction, width sizes of the gap in the different locations can be changed to control magnetic field strength distribution in a plane, thus adjusting uniformity of a membrane thickness.

14 Claims, 3 Drawing Sheets

(51) Int. Cl.
  *H01J 37/34* (2006.01)
  *C23C 14/06* (2006.01)
  *C23C 14/14* (2006.01)
  *H01J 25/58* (2006.01)

(52) U.S. Cl.
  CPC .......... *C23C 14/3414* (2013.01); *C23C 14/35* (2013.01); *H01J 25/58* (2013.01); *H01J 37/3408* (2013.01); *H01J 37/3452* (2013.01)

(56) References Cited

U.S. PATENT DOCUMENTS

| | | |
|---|---|---|
| 6,267,851 B1 * | 7/2001 | Hosokawa ............ C23C 14/352 |
| | | 204/192.12 |
| 7,223,322 B2 | 5/2007 | Bernick |
| 2006/0144703 A1 * | 7/2006 | Yang .................... H01J 37/3408 |
| | | 204/298.16 |
| 2008/0169186 A1 | 7/2008 | Lyanagi et al. |
| 2015/0107769 A1 * | 4/2015 | Nakano ............... C23C 14/0641 |
| | | 156/345.3 |

* cited by examiner ical vapor deposition technology is applicable to many process areas, such as copper interconnection technology, through-silicon via technology in the packaging field, and the like.
MAGNETRON AND MAGNETRON SPUTTERING DEVICE

CROSS REFERENCE TO RELATED APPLICATION

This application claims the benefit of and priority to PCT/CN2014/095758 filed on Dec. 31, 2014, entitled (translation), "MAGNETRON AND MAGNETRON SPUTTERING DEVICE," which claims the benefit of and priority to Chinese Patent Application No. 201410032274.9 filed on Jan. 23, 2014, of which is entitled (translation), "MAGNETRON AND MAGNETRON SPUTTERING DEVICE," and which are hereby incorporated by reference in their entirety into this application.

BACKGROUND

Field of the Invention

Embodiments of the invention relate to the field of sputtering deposition technology, and in particular relates to a magnetron and a magnetron sputtering device.

Description of the Related Art

Physical vapor deposition technology or sputtering deposition technology, which generally refers to a thin-film preparation process employing a physical method to prepare a thin film, is a most widely used type of thin-film fabrication technology in the semiconductor industry. Physical vapor deposition technology is applicable to many process areas, such as copper interconnection technology, through-silicon via technology in the packaging field, and the like.

FIG. 1 is a schematic diagram of a structure of a conventional magnetron sputtering device. The device mainly includes: a process chamber 1, an electrostatic chuck 3 provided inside the process chamber 1 and used for bearing a substrate, a target material 2 and a magnetron 4 provided above the process chamber 1, and a magnetron driving motor 5. There is an air pumping device 13 attached onto a lower end or a sidewall of the process chamber 1. In a magnetron sputtering process, process gas (e.g., argon, or the like) used for generating plasma is fed into the process chamber 1, and under the combined effect of an electric field and a magnetic field inside the chamber, electrons are bounded by the magnetic field generated by the magnetron, the range of motion of the electrons is limited, and moving tracks of the electrons are elongated, which causes the electrons to be ionized to the greatest extent. A part of the ions react on a surface of the target material to form a compound, and another part of the ions, which are attracted by a negative voltage of the target material, bombard the surface of the target material 2, and cause a part of the atoms on the surface of the target material 2 to fall off and be deposited onto a surface of a substrate to be processed, thereby forming a desired film layer.

FIG. 2a is a radial cross-sectional diagram of a magnetron of the conventional art, and FIG. 2b is a target material corrosion curve of the target material corroded by the magnetron in FIG. 2a. Please refer to FIGS. 2a and 2b together. The magnetron includes an outer magnetic pole 102 and an inner magnetic pole 104, both of which have a spiral ring shape and are nested within each other, and in the outer magnetic pole 102 and the inner magnetic pole 104, magnets 108 with opposite polarities are uniformly distributed along the profiles of respective magnetic poles, to form a magnetic field that can bound plasma at a surface of the target material. Further, a constant gap 106 having a spiral ring shape is formed between the outer magnetic pole 102 and the inner magnetic pole 104. The constant gap 106 is used to define a region with a high density of plasma, which is adjacent to a front face of the target material, and form a closed current loop in the plasma to maintain the plasma. During the process, the magnetron performs a rotary scanning on the surface of the target material by taking an inner end 14 of the inner magnetic pole 104 as a center of rotation. The above magnetron is able to realize full target corrosion, and the utilization ratio of the target material is very high.

However, as illustrated in FIG. 2b, FIG. 2b is a target material corrosion curve of the target material corroded by the magnetron in FIG. 2a. It can be seen from the figure that a thickness of the thin film obtained by deposition employing the above magnetron has a poor uniformity. The reason is that: since particles sputtered from positions at different radii of the target material fly to the substrate at different angles, and specifically, an overall angle at which particles sputtered from a periphery of the target material arrive at the substrate is smaller than an overall angle at which particles sputtered from a center of the target material arrive at the substrate, causing the thin film deposited on the surface of the substrate to be thick in the center and thin on the periphery in its radial direction. The uniformity of the thickness of the entire film is greater than 3%, which is poor. Also, because of a relatively long path of a track formed by the gap 106, a relatively large glow voltage is required, and the relatively large glow voltage may cause damage to the surface of a P—GaN substrate in a subsequent ITO thin-film deposition process.

FIG. 2c is a radial cross-sectional diagram of another magnetron of the conventional art. As illustrated in FIG. 2c, the magnetron, with a shape similar to a kidney, includes an outer magnetic pole 62 and an inner magnetic pole 64 with opposite polarities to each other, and a gap 66 having a fixed width is formed therebetween. A track of such a kidney-shaped magnetron 60 does not completely cover a center of a target material (i.e., a center of rotation 14), and does not cover a periphery of the target material either, and thus cannot realize full target scanning. Also, the track of the magnetron defines substantially the same radians in a central region and a peripheral region of the target material, and thus for a short range sputtering, the problem that a deposited thin film is thick in the center and thin on the periphery will occur in the end.

In view of the above-described two types of defects in the conventional art, the question challenging those skilled in the art is: how to provide a magnetron capable of increasing the uniformity of the thickness of the thin film.

SUMMARY

Based on this, it is necessary to provide a uniformly sputtering magnetron and a magnetron sputtering device including the same.

Embodiments of the invention provide a magnetron including an inner magnetic pole and an outer magnetic pole with opposite polarities. According to at least one embodiment, the inner magnetic pole and the outer magnetic pole are each formed of a plurality of spiral lines, wherein the spiral lines of the inner magnetic pole are surrounded by those of the outer magnetic pole, and a gap is provided between the inner magnetic pole and the outer magnetic pole. According to at least one embodiment, the gap has different widths at different positions from a spiral center to a spiral periphery. According to at least one embodiment, the spiral lines of the outer magnetic pole and the spiral lines of the inner magnetic pole satisfy the following polar coordinate equation:

$$r = a \times \theta^n + b \times (\cos \theta)^m + c \times (\tan \theta)^k + d$$

where r and θ are polar coordinates; a, b, c, d are constants; $0 \le n \le 2$, $0 \le m \le 2$, $c=0$ or $k=0$.

According to at least one embodiment, the width of the gap gradually decreases or gradually increases from the spiral center to the spiral periphery.

According to at least one embodiment, the width of the gap ranges from 10 mm to 60 mm.

According to at least one embodiment, quantities of the spiral lines forming the inner magnetic pole and the outer magnetic pole are both three.

According to at least one embodiment, polar coordinate equations for the three spiral lines of the inner magnetic pole are, respectively:

$$r = 4.875 \times \theta^{1.701} + 1.46 \times (\cos \theta)^{1.244} - 26.72, \text{ where } 1.5\pi \le \theta \le 2.6\pi;$$

$$r = 8.31 \times \theta^{1.235} + 10.84 \times (\cos \theta)^{1.362} + 39.02, \text{ where } 1.72\pi \le \theta \le 3.14\pi;$$

$$r = 4.64 \times \theta^2 + 35.84 \times (\cos \theta)^{1.695} - 48.52, \text{ where } 1.1\pi \le \theta \le 1.72\pi;$$

polar coordinate equations for the three spiral lines of the outer magnetic pole are:

$$r = 4.75 \times \theta^{1.92} + 1.25 \times (\cos \theta)^{1.56} + 32.49, \text{ where } 0.25 \le \theta \le 2\pi;$$

$$r = 17.54 \times \theta^{0.78} + 5.45 \times (\cos \theta)^{1.12} + 179.42, \text{ where } 0 \le \theta \le 1.15\pi;$$

$$r = 6.42 \times \theta^{1.98} + 1.88 \times (\cos \theta)^{1.95} + 45.41, \text{ where } 0.3 \le \theta \le 1.14\pi.$$

According to at least one embodiment, the magnetron is applicable to a standard chamber; in the standard chamber, a distance from a target material to a substrate is smaller than 80 mm.

According to at least one embodiment, among the three spiral lines of the outer magnetic pole, two spiral lines correspond to a position at which a periphery of the gap is located, and ends of the two spiral lines are connected end-to-end by an arc line.

According to at least one embodiment, the arc line satisfies the following polar coordinate equation:

$$\rho^2 + 303 \times \rho \times \cos \theta + 140 \times \rho \times \sin \theta + 25872 = 0, \text{ where } \rho \text{ and } \theta \text{ are polar coordinates; } 1.2\pi \le \theta \le 2.2\pi.$$

According to another embodiment, there is provided a magnetron sputtering device, including a magnetron chamber, a vacuum process chamber, a target material, a substrate and a tray. According to at least one embodiment, the magnetron sputtering device further includes any one of the magnetrons provided by the embodiments of the invention, wherein the tray is provided in the vacuum process chamber, an upper surface of the tray used as a bearing surface for bearing the substrate, the magnetron is provided in the magnetron chamber, and the target material is provided between the magnetron chamber and the vacuum process chamber, a back surface of the target material facing the magnetron chamber.

According to at least one embodiment, a distance from the target material to the substrate is 50-80 mm, when the magnetron sputtering device is used for deposition of metal hard mask TiN.

According to at least one embodiment, a distance from the target material to the substrate is 30-90 mm, when the magnetron sputtering device is used for deposition of other nitride than TiN or metal.

According to at least one embodiment, the gap passes through a center and a periphery of the target material, during a scanning performed on the target material by the magnetron.

According to at least one embodiment, the width of the gap gradually decreases from a spiral intermediate part to the spiral center, and the width of the gap gradually decreases from the spiral intermediate part to the spiral periphery as well; or the width of the gap gradually increases from a spiral intermediate part to the spiral center, and the width of the gap gradually increases from the spiral intermediate part to the spiral periphery as well.

BRIEF DESCRIPTION OF THE DRAWINGS

These and other features, aspects, and advantages of the invention are better understood with regard to the following Detailed Description, appended Claims, and accompanying Figures. It is to be noted, however, that the Figures illustrate only various embodiments of the invention and are therefore not to be considered limiting of the invention's scope as it may include other effective embodiments as well.

FIG. 2b is a target material corrosion curve of the target material corroded by the magnetron in FIG. 2a.

DETAILED DESCRIPTION

Advantages and features of the invention and methods of accomplishing the same will be apparent by referring to embodiments described below in detail in connection with the accompanying drawings. However, the invention is not limited to the embodiments disclosed below and may be implemented in various different forms. The embodiments are provided only for completing the disclosure of the invention and for fully representing the scope of the invention to those skilled in the art.

In order to address the problem of poor uniformity of a thickness of a thin film, there is proposed a magnetron and a magnetron sputtering device to obtain a thin film with a uniform thickness.

Figure 3:
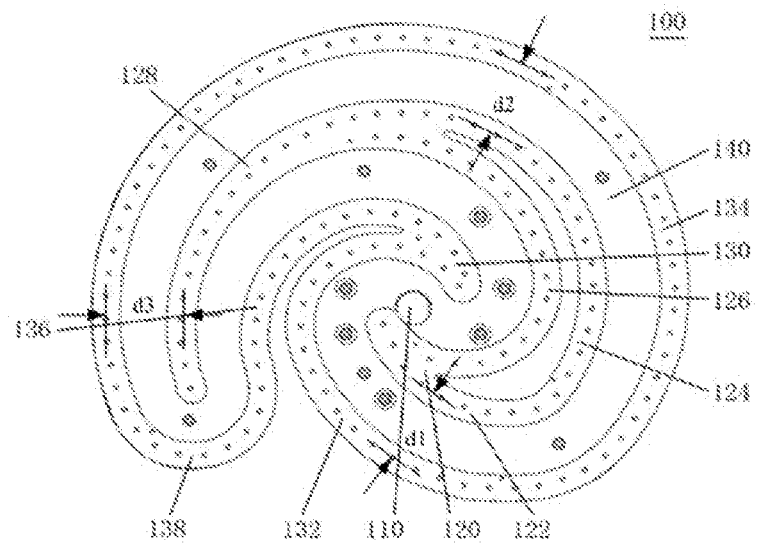
FIG. 3 is a schematic diagram of a magnetron provided by an embodiment of the invention.

Referring to FIG. 3, which is a schematic diagram of a magnetron of the present invention, a magnetron 100 includes an inner magnetic pole 120 and an outer magnetic pole 130 with opposite polarities to each other, the inner magnetic pole 120 and the outer magnetic pole 130 are each formed of a plurality of spiral lines, the spiral lines of the inner magnetic pole 120 are surrounded by the spiral lines of the outer magnetic pole 130, and the spiral lines of the inner magnetic pole 120 and the outer magnetic pole 130 both satisfy the following polar coordinate equation:

$$r = a \times \theta^n + b \times (\cos \theta)^m + c \times (\tan \theta)^k + d;$$

where a coordinate origin 110 is the center of the spiral, r and θ are polar coordinates; a, b, c, d are constants. Let c=0 or k=0; 0≤n≤2; 0≤m≤2.

According to at least one embodiment, the coordinate origin 110 is the spiral center of the spiral lines of the inner magnetic pole 120, and the spiral lines of the inner magnetic pole 120 are around the coordinate origin 110; the coordinate origin 110 is also the spiral center of the spiral lines of the outer magnetic pole 130.

Specifically, as illustrated in FIG. 3, quantities of the spiral lines forming the inner magnetic pole 120 and the outer magnetic pole 130 are both three. The spiral lines forming the inner magnetic pole 120 are a first inner spiral line 122, a second inner spiral line 124 and a third inner spiral line 126; the spiral lines forming the outer magnetic pole 130 are a first outer spiral line 132, a second outer spiral line 134 and a third outer spiral line 136.

According to at least one embodiment, polar coordinate equations for the first inner spiral line 122, the second inner spiral line 124, and the third inner spiral line 126 forming the inner magnetic pole 120 are as follows, respectively:

$$r=4.875\times\theta^{1.701}+1.46\times(\cos\theta)^{1.244}-26.72, \text{ where } 1.5\pi\leq\theta\leq2.6\pi; \quad (1)$$

$$r=8.31\times\theta^{1.235}+10.84\times(\cos\theta)^{1.362}+39.02, \text{ where } 1.72\pi\leq\theta\leq3.14\pi; \quad (2)$$

$$r=4.64\times\theta^2+35.84\times(\cos\theta)^{1.695}-48.52, \text{ where } 1.1\pi\leq\theta\leq1.72\pi. \quad (3)$$

Polar coordinate equations for the first outer spiral line 132, the second outer spiral line 134, and the third outer spiral line 136 forming the outer magnetic pole 130 are as follows, respectively:

$$r=4.75\times\theta^{1.92}+1.25\times(\cos\theta)^{1.56}+32.49, \text{ where } 0.25\leq\theta\leq2\pi; \quad (1)$$

$$r=17.54\times\theta^{0.78}+5.45\times(\cos\theta)^{1.12}+179.42, \text{ where } 0\leq\theta\leq1.15\pi; \quad (2)$$

$$r=6.42\times\theta^{1.98}+1.88\times(\cos\theta)^{1.95}+45.41, \text{ where } 0.3\leq\theta\leq1.14\pi. \quad (3)$$

In the present embodiment, ends of two spiral lines of the outer magnetic pole 130 corresponding to a periphery of a gap 140 are connected end-to-end with one another by an arc line, that is, the second outer spiral line 134 and the third outer spiral line 136 are connected using an arc line 138 therebetween. A center of a circle where the arc 138 is located is at a position (−151.5, −70) of the coordinate system, a radius of the arc 138 is 44.5 mm, and a curve equation for the arc 138 is:

$$\rho^2+303\times\rho\times\cos\theta+140\times\rho\times\sin\theta+25872=0, \text{ where } \rho \text{ and } \theta \text{ are polar coordinates}; 1.2\pi\leq\theta\leq2.2\pi.$$

According to at least one embodiment, in addition to the arc 138 connecting the second outer spiral line 134 and the third outer spiral line 136, arc lines are used also for connections between the three spiral lines of the inner magnetic pole 120, and between the rest of the adjacent ends of the three spiral lines of the outer magnetic pole 130, so that the three spiral lines forming the inner magnetic pole 120 and the three spiral lines forming the outer magnetic pole 130 form respective smooth curves, to form a closed gap 140.

According to at least one embodiment, for a magnetron provided by an embodiment of the present invention, a gap between the inner magnetic pole and the outer magnetic pole obtained by following the above polar coordinate equations is approximately in a spiral shape, and the number of cycles of the spiral shape is relatively few (the gap 140 can be seen as two tracks spirally wound in parallel for one round), so that a relatively short plasma path can be obtained, and further a glow voltage of the plasma can be lowered, thereby preventing a surface of a P—GaN substrate from being damaged during a subsequent ITO thin-film deposition process.

According to at least one embodiment, in addition, the gap 140 has different widths at different positions from the center to the periphery of the spiral. Specifically, as illustrated in FIG. 3, the gap 140 is in a closed ring shape, and the ring shape is bent in a spiral manner, and has one end close to a center of the spiral of the inner magnetic pole 120 or the outer magnetic pole 130, and the other end spirally extending outwards around the center of the spiral; the different positions of the gap 140 from the center to the periphery of the spiral refer to different positions of the gap 140 from an end thereof close to the center of the spiral to an end thereof far from the center of the spiral. The larger the width of the above gap 140, the smaller the intensity of the magnetic field at the gap 140; otherwise, the smaller the width of the above gap 140, the greater the intensity of the magnetic field at the gap 140. Thus, in-plane intensity distribution of the magnetic field may be controlled by changing a magnitude of the width of the gap 140 at different positions from the center to the periphery of the spiral, thereby increasing a uniformity of a thickness of a thin film.

According to at least one embodiment, the gap 140 is divided into three parts successively from an end thereof close to the center of the spiral to an end thereof far from the center of the spiral, which are a spiral center, a spiral intermediate part, and a spiral periphery, respectively. And, depending on a difference in distribution of a thickness of a thin film on a surface of a substrate in its radial direction, the width of the gap 140 may gradually decrease or gradually increase from the spiral center to the spiral periphery; or, the width of the gap 140 may gradually decrease from the spiral intermediate part to the spiral center, and gradually decrease from the spiral intermediate part to the spiral periphery; or, the width of the gap 140 may gradually increase from the spiral intermediate part to the spiral center, and gradually increase from the spiral intermediate part to the spiral periphery, so that the thickness of the thin film tends to be uniform in the end. Preferably, the width of the gap 140 ranges from 10 mm to 60 mm.

According to at least one embodiment, for example, if there is a problem that the thin film is thick in the center and thin on the periphery, then the width of the gap 140 may gradually decrease from the spiral center to the spiral periphery, that is, d1>d2>d3, which causes the magnetic field of the magnetron 100 at the spiral center to be weak, and the magnetic field at the spiral periphery to be strong, and also reduces a quantity of particles sputtered from the center by a certain extent, while increasing a quantity of particles sputtered from the periphery, so that the thickness of the thin film tends to be uniform in the end. Preferably, the width of the gap 140 at the spiral center d1 (40 mm) is progressively decreased to the width of the gap 140 at the spiral periphery d3 (30 mm). The uniformity of the thickness of the thin film obtained by deposition applying the magnetron provided by the present embodiment is less than 3%. But the present invention is not limited thereto. If there is a problem that the thin film is thin in the center and thick on the periphery, then the width of the gap 140 may gradually increase from the spiral center to the spiral periphery of the magnetron, that is, d1<d2<d3. Further, in order to better refine the control, the width of the gap 140 may gradually decrease from the spiral intermediate part to the spiral center of the magnetron, and the width of the gap 140 may gradually decrease from the spiral intermediate part to the spiral periphery as well, that is, d2>d1 and d2>d3; or, the width of the gap 140 may gradually increase from the spiral intermediate part to the spiral center of the magnetron 100, and the width of the gap 140 may gradually increase from the spiral intermediate part to the spiral periphery as well, that is, d2<d1 and d2<d3.

Figure 4:
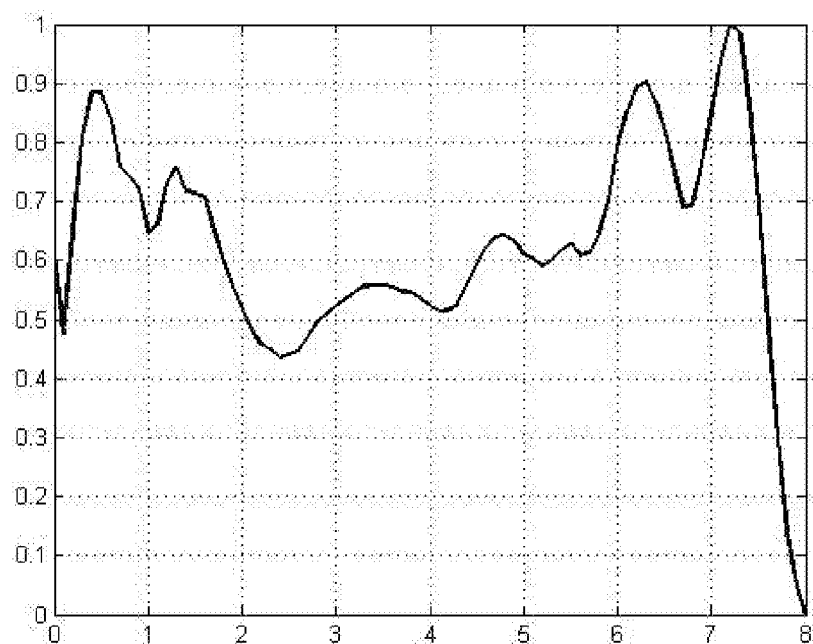
FIG. 4 is a target material corrosion curve of a magnetron sputtering device provided by an embodiment of the invention.

According to at least one embodiment, referring to FIG. 4, which is a target material corrosion curve of a magnetron sputtering device of the present invention. The center of the spiral of the spiral lines of the inner magnetic pole 120 is the coordinate origin 110 of the spiral-shaped magnetron 100, the coordinate origin 110 passes through the center of the target material in a vertical direction, and the spiral lines of the outer magnetic pole 130 cover the periphery of the target material, so that a path of plasma passes through the center and the periphery of the target material, to realize uniform corrosion of the entire target.

Figure 1:
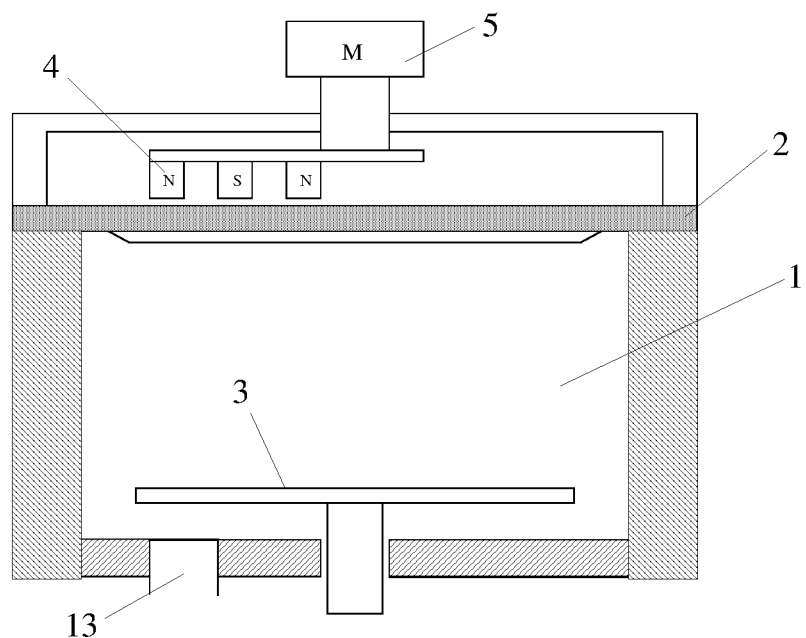
FIG. 1 is a schematic diagram of a structure of a conventional magnetron sputtering device.
Figure 2A:
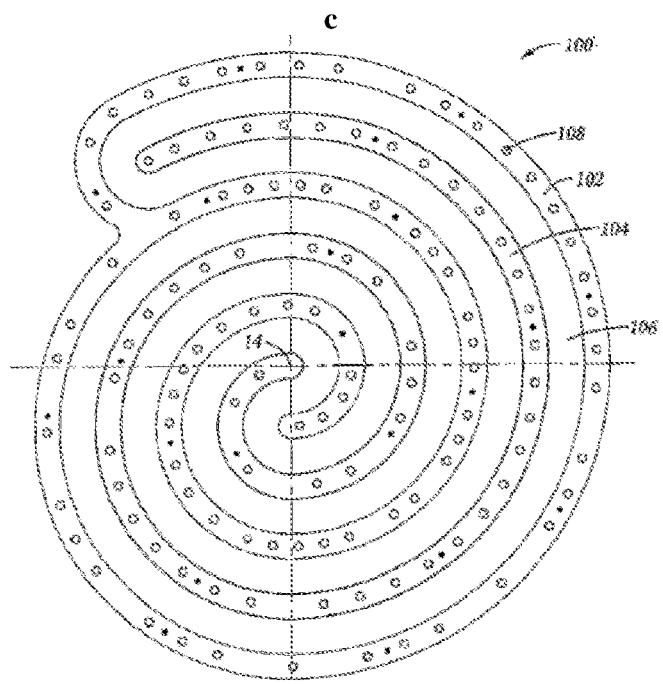
FIG. 2a is a radial cross-sectional diagram of a magnetron of the conventional art.
Figure 2B:
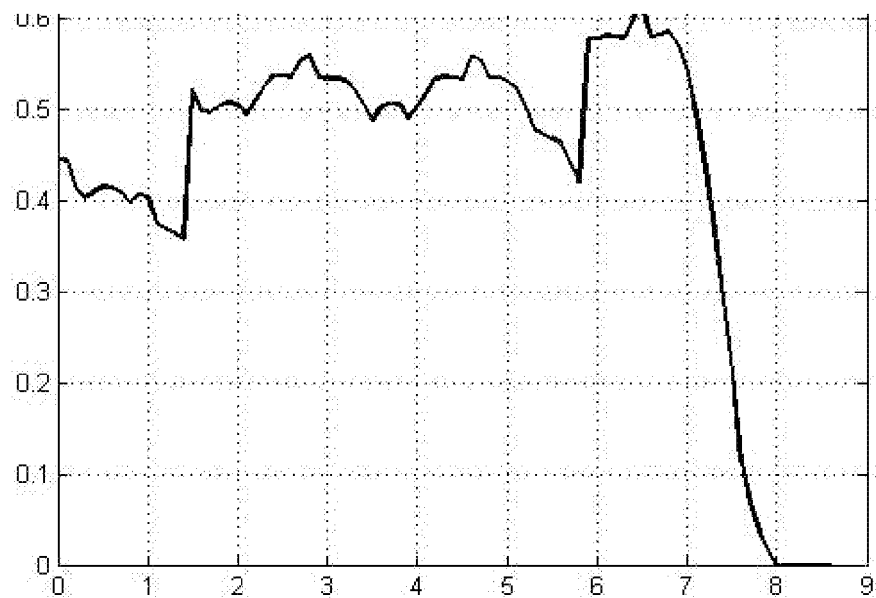
Figure 2C:
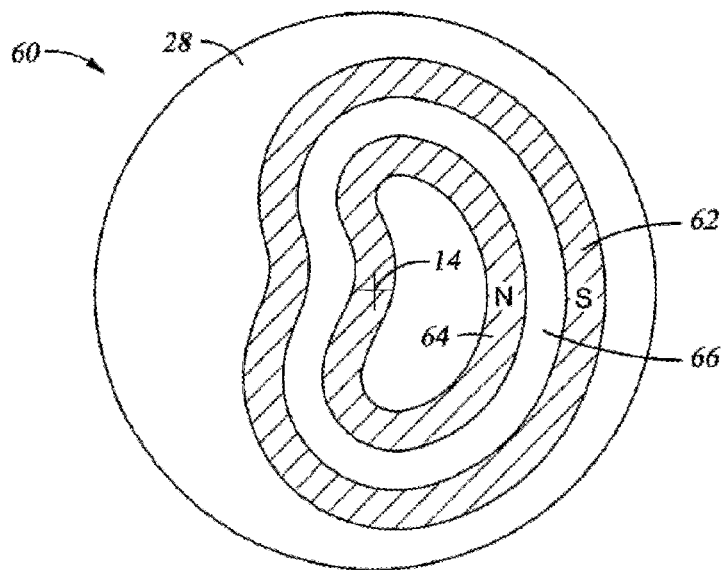
FIG. 2c is a radial cross-sectional diagram of another magnetron of the conventional art.

According to another embodiment, the magnetron provided by an embodiment of the invention can not only improve a uniformity of a thickness of a thin film, but also improve a uniformity of a sheet resistance of a metal hard mask. Specifically, in the sputtering deposition technology, deposition of metal (e.g., copper, titanium, tantalum and the like) or reactive sputtering of metal compound (e.g., tantalum nitride) is performed, the sheet resistance and the thickness of them are substantially the same throughout a wafer, and the product of these two parameters, i.e., resistivity is substantially the same throughout the wafer. However, for the reactive sputtering of hard metals (such as TiN, AlN, Ti and the like), because there are multiple forms of TiN, if one of the two process characteristics, i.e., the uniformity of the thickness and the uniformity of the sheet resistance of the thin film, becomes good, the other becomes poor. From this perspective, when a hard metal is sputtered, if a path of plasma of the magnetron is too short, the sheet resistance uniformity of the thin film would be poor; otherwise, if a path of plasma of the magnetron is too long, although the sheet resistance uniformity may be improved, a high glow voltage is required, which may cause damage to a surface of a P—GaN substrate in a subsequent ITO thin film deposition process. Thus, an appropriate path of plasma of the magnetron must be chosen, for the purpose of improving the sheet resistance uniformity while keeping the glow voltage low. As for the magnetron provided by an embodiment of the present invention, compared to the prior art, the path of plasma thereof is shorter than that of the magnetron illustrated in FIG. 1, and longer than that of the magnetron illustrated in FIG. 2a, so that the sheet resistance uniformity can be improved while keeping the glow voltage low. Meanwhile, the magnetron provided by an embodiment of the present invention can control in-plane intensity distribution of a magnetic field by changing a magnitude of the width of the gap 140 at different positions from the spiral center to the spiral periphery, and thus improve the uniformity of the thickness of the thin film, so not only the thickness uniformity and the sheet resistance uniformity of the thin film, but also the uniformity of the resistivity can be improved.

According to at least one embodiment, it is indicated by experimental data that when performing deposition of hard metal using the magnetron provided by the present embodiment, for a thin film obtained at high temperature and high pressure (>5 mT), the sheet resistance uniformity is less than 5%, and the thickness uniformity is less than 3%; for a thin film obtained at room temperature and high pressure (>5 mT), the sheet resistance uniformity is less than 3%, and the thickness uniformity is less than 6%. Both satisfy the process requirements of the present stage. Further, the magnetron provided by the present embodiment not only is suitable for reactive sputtering deposition of hard metal, but also can obtain a hard metal thin film with a sheet resistance uniformity less than 3% through sputtering deposition.

According to another embodiment, a magnetron sputtering device is also provided. The magnetron sputtering device includes a magnetron chamber, a vacuum process chamber, a target material, a substrate, a tray, and the above magnetron 100.

According to at least one embodiment, the tray is provided in the vacuum process chamber, an upper surface of the tray is used as a bearing surface for bearing the substrate; the magnetron 100 is provided in the magnetron chamber; the target material is provided between the magnetron chamber and the vacuum process chamber, a back surface of the target material faces the magnetron chamber.

According to at least one embodiment, to improve the sputtering efficiency, the magnetron 100 is placed on the back surface of the target material. The magnetron 100 includes magnets with opposite polarities, that is, one or more magnets with opposite polarities form the inner magnetic pole 120 and the outer magnetic pole 130, respectively, to form a spiral-shaped inner track and a spiral-shaped outer track, respectively.

According to at least one embodiment, the magnets forming the inner magnetic pole 120 and the outer magnetic pole 130 are located on respective tracks of the spiral lines of the inner magnetic pole 120 and the spiral lines of the outer magnetic pole 130, and the magnets are bounded by the tracks and generate a magnetic field within a range of the chamber close to the magnets.

According to at least one embodiment, the inner magnetic pole 120 of the magnetron 100 is surrounded by the magnets with an opposite polarity of the outer magnetic pole 130.

According to at least one embodiment, for the purpose of uniform sputtering, the magnetron 100 is driven by a motor and performs a uniform scanning on the surface of the target material. The rotation speed of the motor is 60-100 rpm.

According to at least one embodiment, the gap passes through a center and a periphery of the target material during the scanning of the target material by the magnetron, so that a spiral center of the spiral lines of the inner magnetic pole 120 is the coordinate origin 110 of the spiral-shaped magnetron 100. The coordinate origin 110 passes through the center of the target material in a vertical direction, and the spiral lines of the outer magnetic pole 130 cover the periphery of the target material, so that a path of plasma passes through the center and the periphery of the target material, to realize uniform corrosion of the entire target.

According to at least one embodiment, as one possible implementation, when the magnetron sputtering device is used for deposition of metal hard mask TiN, a process pressure may be 2-15 mT, a power may be no greater than 20 kW, and a distance between the target material and the substrate may be 50-80 mm.

According to at least one embodiment, as one possible implementation, when the magnetron sputtering device is used for deposition of other nitride than TiN or metal, such as AlN, Cu, Ti and the like, a process pressure may be 1-20 mT, a power may be no greater than 40 kW, and a distance between the target material and the substrate may be 30-90 mm.

In the above cases, an excellent sputtering deposition effect can be obtained. The magnetron 100 and the magnetron sputtering device are also suitable for sputtering depositions under various process conditions, and have a wide application range.

Embodiments of the invention provide non-obvious advantages over the conventional art. For example, compared to the conventional art, beneficial effects of various embodiments of the invention are as follows:

The magnetron, according to an embodiment of the invention, includes an inner magnetic pole and an outer magnetic pole with opposite polarities, a gap is formed between the adjacent inner magnetic pole and the outer magnetic pole, and the gap has different widths at different positions from a spiral center to a spiral periphery, so that in-plane intensity distribution of a magnetic field tends to be uniform, thereby enhancing the uniformity of the thickness of the thin film. Meanwhile, the gap between the inner magnetic pole and the outer magnetic pole of the magnetron provided by the present invention is approximately in a spiral shape, and the number of cycles of the spiral shape is relatively few, so that a relatively short path of plasma can be obtained, and further a glow voltage of the plasma can be lowered, thereby preventing a surface of a P—GaN substrate from being damaged during a subsequent ITO thin-film deposition process.

According to an embodiment, the width of the gap gradually decreases from the spiral center to the spiral periphery. At this time, the spiral-shaped magnetron generates a relatively weak magnetic field at the center of the target material, and a relatively strong magnetic field at the periphery of the target material, so that quantities of particles deposited at different positions on the substrate are substantially equal in a radial direction, thereby increasing the uniformity of the film thickness. The uniformity of the thickness of the thin film obtained by deposition applying the magnetron provided by the present embodiment is less than 3%.

Terms used herein are provided to explain embodiments, not limiting the invention. Throughout this specification, the singular form includes the plural form unless the context clearly indicates otherwise. When terms "comprises" and/or "comprising" used herein do not preclude existence and addition of another component, step, operation and/or device, in addition to the above-mentioned component, step, operation and/or device.

Embodiments of the invention may suitably comprise, consist or consist essentially of the elements disclosed and may be practiced in the absence of an element not disclosed. According to at least one embodiment, it can be recognized by those skilled in the art that certain steps can be combined into a single step.

The terms and words used in the specification and claims should not be interpreted as being limited to typical meanings or dictionary definitions, but should be interpreted as having meanings and concepts relevant to the technical scope of the invention based on the rule according to which an inventor can appropriately define the concept of the term to describe the best method he or she knows for carrying out the invention.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

The singular forms "a," "an," and "the" include plural referents, unless the context clearly dictates otherwise.

As used herein and in the appended claims, the words "comprise," "has," and "include" and all grammatical variations thereof are each intended to have an open, non-limiting meaning that does not exclude additional elements or steps.

As used herein, it will be understood that unless a term such as 'directly' is not used in a connection, coupling, or disposition relationship between one component and another component, one component may be 'directly connected to', 'directly coupled to' or 'directly disposed to' another element or be connected to, coupled to, or disposed to another element, having the other element intervening therebetween.

As used herein, the terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical or non-electrical manner. Objects described herein as being "adjacent to each other may be in physical contact with each other, in close proximity to each other, or in the same general region or area as each other, as appropriate for the context in which the phrase is used. Occurrences of the phrase "according to an embodiment" herein do not necessarily all refer to the same embodiment.

It also could be understood that the foregoing implementations are merely exemplary implementations used for the purpose of explaining the principle of the embodiments of the invention, but the present invention is not limited thereto. Many variations and improvements can be made by those of ordinary skill in the art without departing from the spirit and essence of the embodiments of the invention. These variations and improvements are also regarded as the protection scope of the embodiments of the invention.

The invention claimed is:

1. A magnetron, comprising:
   an inner magnetic pole; and
   an outer magnetic pole with opposite polarities,
   wherein the inner magnetic pole is formed of three spiral lines including a first inner magnetic pole spiral line, a second inner magnetic pole spiral line and a third inner magnetic pole spiral line;
   wherein the outer magnetic pole is formed of three spiral lines, which are respectively, a first outer magnetic pole spiral line, a second outer magnetic pole spiral line, and a third outer magnetic pole spiral line,
   wherein the spiral lines of the inner magnetic pole and the spiral lines of the outer magnetic pole have a same spiral center, each of the spiral lines has a first end close to the spiral center and a second end spirally extending outwards around the spiral center;
   wherein the second outer magnetic pole spiral line is the farthest spiral line from a spiral center, and wherein an open gap is provided between the first outer magnetic pole spiral line and the third outer magnetic pole spiral line, wherein the second end of the second inner magnetic pole spiral line and the second end of the third inner magnetic pole spiral line are merged, and the merged second end of the second inner magnetic pole spiral line and the third inner magnetic pole spiral line extends along a track of the second inner magnetic pole spiral line;

wherein the second end of the first inner magnetic pole spiral line and the first end of the second inner magnetic pole spiral line are connected by an arc line, the arc line and the spiral lines satisfy different polar coordinate equations;

wherein the spiral lines of the inner magnetic pole are surrounded by the spiral lines of the outer magnetic pole, and a gap is provided between the inner magnetic pole and the outer magnetic pole, and wherein the gap has different widths at different positions from the spiral center to a spiral periphery, the different positions of the gap from the spiral center to the spiral periphery refer to different positions of the gap from an end close to the spiral center to an end far from the spiral center, and wherein the spiral lines of the outer magnetic pole and the spiral lines of the inner magnetic pole satisfy the following polar coordinate equation:

$$r = a \times \theta^n + b \times (\cos\theta)^m + c \times (\tan\theta)^k + d$$

where r and $\theta$ are polar coordinates; a, b, c, d are constants; $0 \le n \le 2$, $0 \le m \le 2$, $c=0$ or $k=0$.

2. The magnetron according to claim 1, wherein the width of the gap decreases or increases from the spiral center to the spiral periphery.

3. The magnetron according to claim 1, wherein the width of the gap ranges from 10 mm to 60 mm.

4. The magnetron according to claim 1, wherein quantities of the spiral lines forming the inner magnetic pole and the outer magnetic pole are both three.

5. The magnetron according to claim 4, wherein polar coordinate equations for the three spiral lines of the inner magnetic pole are, respectively:

$$r = 4.875 \times \theta^{1.701} + 1.46 \times (\cos\theta)^{1.244} - 26.72, \text{ where}$$
$$1.5\pi \le \theta \le 2.6\pi;$$

$$r = 8.31 \times \theta^{1.235} + 10.84 \times (\cos\theta)^{1.362} + 39.02, \text{ where}$$
$$1.72\pi \le \theta \le 3.14\pi;$$

$$r = 4.64 \times \theta^2 + 35.84 \times (\cos\theta)^{1.695} - 48.52, \text{ where}$$
$$1.1\pi \le \theta \le 1.72\pi; \text{ and}$$

polar coordinate equations for the three spiral lines of the outer magnetic pole are:

$$r = 4.75 \times \theta^{1.92} + 1.25 \times (\cos\theta)^{1.56} + 32.49, \text{ where}$$
$$0.25 \le \theta \le 2\pi;$$

$$r = 17.54 \times \theta^{0.78} + 5.45 \times (\cos\theta)^{1.12} + 179.42, \text{ where}$$
$$0 \le \theta \le 1.15\pi;$$

$$r = 6.42 \times \theta^{1.98} + 1.88 \times (\cos\theta)^{1.95} + 45.41, \text{ where}$$
$$0.3 \le \theta \le 1.14\pi.$$

6. The magnetron according to claim 1, wherein the magnetron is applicable to a standard chamber; and
in the standard chamber, a distance from a target material to a substrate is smaller than 80 mm.

7. The magnetron according to claim 4, wherein among the three spiral lines of the outer magnetic pole, two spiral lines correspond to a position at which a periphery of the gap is located, and ends of the two spiral lines are connected end-to-end by an arc line.

8. The magnetron according to claim 7, wherein the arc line satisfies the following polar coordinate equation:

$$\rho^2 + 303 \times \rho \times \cos\theta + 140 \times \rho \times \sin\theta + 25872 = 0,$$

where $\rho$ and $\theta$ are polar coordinates; $1.2\pi \le \theta \le 2.2\pi$.

9. A magnetron sputtering device, comprising a magnetron chamber, a vacuum process chamber, a target material, a substrate and a tray, and further comprising the magnetron according to claim 1,
wherein the tray is provided in the vacuum process chamber, an upper surface of the tray used as a bearing surface for bearing the substrate,
wherein the magnetron is provided in the magnetron chamber, and
wherein the target material is provided between the magnetron chamber and the vacuum process chamber, a back surface of the target material facing the magnetron chamber.

10. The magnetron sputtering device according to claim 9, wherein a distance from the target material to the substrate is 50-80 mm, when the magnetron sputtering device is used for deposition of metal hard mask TiN.

11. The magnetron sputtering device according to claim 9, wherein a distance from the target material to the substrate is 30-90 mm, when the magnetron sputtering device is used for deposition of nitride other than TiN or metal.

12. The magnetron sputtering device according to claim 9, wherein the gap passes through a center and a periphery of the target material, during a scanning performed on the target material by the magnetron.

13. The magnetron according to claim 1, wherein the width of the gap decreases from a spiral intermediate part to the spiral center, and the width of the gap decreases from the spiral intermediate part to the spiral periphery as well; or
the width of the gap increases from a spiral intermediate part to the spiral center, and the width of the gap increases from the spiral intermediate part to the spiral periphery as well.

14. The magnetron according to claim 1, wherein the width of the gap decreases from 40 mm at the spiral center to 30 mm at the spiral periphery.

\* \* \* \* \*